United States Patent [19]

Arakawa

[11] Patent Number: 5,039,882
[45] Date of Patent: Aug. 13, 1991

[54] ADDRESS DECODER CIRCUIT FOR NON-VOLATILE MEMORY

[75] Inventor: Hideki Arakawa, Kanagawa, Japan

[73] Assignee: Sony Corporation, Tokyo, Japan

[21] Appl. No.: 421,144

[22] Filed: Oct. 13, 1989

[30] Foreign Application Priority Data

| Oct. 15, 1988 | [JP] | Japan | 63-260189 |
| Oct. 25, 1988 | [JP] | Japan | 63-270523 |
| Oct. 25, 1988 | [JP] | Japan | 63-270524 |

[51] Int. Cl.$^5$ ............................................. H03K 17/16
[52] U.S. Cl. .................................. 307/449; 307/443; 307/451; 307/296.2; 365/230.06
[58] Field of Search ............... 307/443, 449, 451, 465, 307/469, 296.2; 365/185, 225, 230.06

[56] References Cited

U.S. PATENT DOCUMENTS

| 4,365,316 | 12/1982 | Iwahashi et al. | 307/449 X |
| 4,538,247 | 8/1985 | Venkateswaran | 307/449 X |
| 4,649,521 | 3/1987 | Tsuchida et al. | 365/230.06 X |
| 4,820,941 | 4/1989 | Dolby et al. | 307/449 |
| 4,829,203 | 5/1989 | Ashmore Jr. | 307/465 X |
| 4,866,307 | 9/1989 | Ashmore Jr. | 307/469 |
| 4,893,275 | 1/1990 | Tanaka et al. | 365/230.06 X |
| 4,899,315 | 2/1990 | Houston | 307/449 X |
| 4,958,317 | 9/1990 | Terada et al. | 365/185 X |
| 4,982,113 | 1/1991 | Jinbo | 307/465 |
| 4,987,325 | 1/1991 | Seo | 307/465 |

FOREIGN PATENT DOCUMENTS 1363509 8/1974 United Kingdom .
2127642 4/1984 United Kingdom .

OTHER PUBLICATIONS

Bello, "MOSFET Load Gate Controlled Driven," *IBM T.D.B.*, vol. 15, No. 3, Aug. 1972.

Primary Examiner—David Hudspeth

[57] ABSTRACT

An address decoder circuit adapted for enabling electrical erasure in a non-volatile memory without the necessity of numerically increasing the component elements, wherein the direction of application (polarity) of a supply voltage during an erasing operation to a decoding logic gate portion comprising a load MOS transistor and an address input MOS transistor is rendered different from that during a writing or reading operation, and a third potential is applied to the power terminal proximate to the address input MOS transistor and also to the power terminal of a buffer, whereby the third potential is outputted to prevent erasure in the state of non-selection. The resistance of load means is changed to be greater in a writing operation for reducing the power consumption during the writing operation and minimizing the dimensions of component elements. And in a voltage supply circuit, for the purpose of outputting a desired voltage without providing any additional circuit which may consume great power or without causing any level reduction of a first or write voltage, a MOS transistor for outputting the first voltage is controlled in response to a signal obtained by boosting the voltage of a control signal through a voltage multiplier.

5 Claims, 12 Drawing Sheets

ADDRESS DECODER CIRCUIT FOR NON-VOLATILE MEMORY

BACKGROUND OF THE INVENTION

1. Field of the Invention

The present invention relates to an address decoder circuit for a non-volatile memory and, more particularly, to an address decoder circuit which is capable of carrying out electrical erasure by applying a negative voltage to the control gate of a floating-gate type non-volatile memory and thereby injecting positive holes into its floating gate.

The invention also relates to an address decoder circuit which comprises load means and MOS transistors fed with address signals and receives a variable supply voltage whose absolute value in a writing operation is greater than that in a reading operation.

The invention further relates to a voltage supply circuit and, more particularly, to a circuit for selectively outputting, in response to a control signal, a first voltage used for a writing operation or a second voltage used for a reading or standby operation.

2. Description of the Prior Art

An address decoder circuit for use in an electrically rewritable memory such as EPROM (electrically programmable read-only memory) or E$^2$PROM (electrically erasable and programmable read-only memory) has three output levels including a high voltage (10 to 30 volts), an intermediate voltage (5 volts) and a reference potential (0 volt) in comparison with an address decoder circuit for some other memory such as static RAM, dynamic RAM or the like. And another feature thereof is the necessity of preparing, for execution of a test, an entire selection mode (where entire outputs are at a high level) or an entire non-selection mode (where entire outputs are at a low level).

There are presently existent great demands for reducing the number of component elements in the address decoder circuit of an EPROM or E$^2$PROM, particularly in that of an EPROM. The reason for such demands is based on the fact that, in the case of any EPROM where one transistor cell has a capacity of 1 M bits, it becomes necessary to dispose one-row decoder circuit within a length of 4 to 5 microns. A consideration will now be given below with regard to the history of the progress in high integration of the address decoder circuit for such EPROM or E$^2$PROM. FIG. 5 shows a conventional address decoder circuit introduced as a known example in the Japanese Patent Publication No. 63 (1988)-22396. In this circuit diagram, Ql–Qn denote n-channel address input MOS transistors connected in series with one another to receive address signals Al–An as input signals respectively. One end of such series circuit (source of MOS transistor Ql) is grounded. Denoted by Ql is a p-channel load MOS transistor whose source and back gate are connected to the terminal of a power source Vcc and whose drain is connected to the other end (drain of MOS transistor Qn) of the series circuit consisting of the address input MOS transistors Ql–Qn. The node thereof serves as an output point of the decoding portion (logic gate portion) of the address decoder circuit, and the signal outputted therefrom is fed via an n-channel MOS transistor Qt, which functions as a transfer gate, to a buffer circuit Bu consisting of a MOS inverter. The buffer circuit Bu operates at a high supply voltage (write voltage) Vpp of, e.g. 10 to 30 volts during a write mode or at a normal supply voltage Vcc of, e.g. 5 volts during any other mode. Denoted by Qf is a p-channel pullup MOS transistor whose source and back gate receive the write voltage Vpp during a write mode or the normal supply voltage Vcc during any other mode. Its gate electrode receives the output of the buffer circuit Bu, while its drain is connected to the input of the buffer circuit Bu. The MOS transistor Qt serving as a transfer gate prevents flow of a great current from the variable power terminal (Vpp/Vcc) via the MOS transistor Qf and the load MOS transistor Ql to the normal-voltage power terminal (Vcc). Another conventional address decoder circuit so contrived as to eliminate the necessity of such MOS transistor Qt is introduced as an improved invention relative to the application of the aforementioned Japanese Patent Publication No. 63 (1988)-22396, which is shown in FIG. 6. According to this address decoder circuit, the back gate of the load MOS transistor Ql is connected to the variable power terminal (Vpp/Vcc) instead of the normal power terminal (Vcc), and the gate electrode is connected to the drain of the load MOS transistor Ql without being grounded. Due to such arrangement, even when the input side of the buffer Bu is turned to the level of a write voltage Vpp during a write mode by the pullup MOS transistor Qf, both the back gate and the gate electrode of the load MOS transistor Ql are turned to the level of its write voltage Vpp, and the potential difference between the back gate and the gate electrode is rendered zero while the gate-source voltage of the load MOS transistor Ql is reduced to zero. In case the transistor Ql is so driven that the current flows therein in the inverse direction as in this example, it follows that the region (usually the drain of the transistor Ql connected to the address input n-channel MOS transistor) functions as a source, not as a drain. Consequently, the load MOS transistor Ql serving as an enhancement-mode MOS transistor is cut off to prevent flow of wasteful current from the variable power terminal to the normal power terminal. Therefore the MOS transistor Qt used as a transfer gate is rendered unnecessary to eventually reduce the number of required elements at a rate of one per address decoder circuit. In view of this point, the address decoder circuit of FIG. 6 is superior to the former example of FIG. 5.

FIG. 7 shows another conventional address decoder circuit formed into a further compact constitution, which is introduced in "1955 ISSCC Digest", pp. 166-167. In this address decoder circuit, the output of the circuit consisting of address input MOS transistors Ql–Qn and a load MOS, transistor Ql is fed directly to a buffer Bu, and a depletion-mode MOS transistor Qt is interposed between the buffer Bu and a word line WL of a memory cell array. And a polysilicon p-channel MOS transistor is interposed between the variable power terminal (Vpp/Vcc) and the word line WL. Both the MOS transistor Qt and the polysilicon MOS transistor receive, at the gate electrodes thereof, a signal obtained by inverting a program signal PGM. In such known address decoder circuit, the buffer Bu is not connected to the variable power terminal but is so connected as to receive the supply voltage from the normal power terminal Vcc. And a writing operation is performed via the polysilicon p-channel MOS transistor.

Although such address decoder circuit is superior as viewed, from high integration density, it needs a depletion-mode MOS transistor Qt to consequently require one additional mask with another disadvantage of a numerical increase in the steps of manufacture, hence raising a problem of increased production cost. Furthermore, the polysilicon MOS transistor used to perform a writing operation comes to have a greater on-resistance to eventually bring about an impediment in attaining an enhanced faster operation.

FIG. 8 shows another conventional address decoder circuit where a variable supply voltage Vpp/Vcc is applied to a logic gate portion consisting of address input MOS transistors Q1-Qn and a load MOS transistor Ql. This example is introduced in "1988 ISSCC Digest", pp. 120-121. According to the above, the source of the load MOS transistor Ql is connected to the variable power terminal (Vpp/Vcc) in the same manner as the power terminal of the buffer Bu, so that there occurs no potential difference between the two power terminals. Consequently, the provision of a transfer gate is not necessary. Furthermore, since the pullup function can be performed by the load MOS transistor Ql itself, there is no need of providing any pullup MOS transistor either. Therefore the address decoder circuit shown in FIG. 8 requires the least number of component elements to eventually realize the greatest integration density.

However, any of the known address decoder circuits described above is incapable of carrying out electrical erasure to a non-volatile memory. As it has been considered heretofore that electrical erasure is impossible for the EPROM, such erasure is executed customarily by irradiation of ultraviolet rays.

The present inventor previously accomplished an improved non-volatile memory capable of carrying out electrical erasure even with the same constitution as that of an EPROM (as already filed in Japanese Patent Application No. 62 (1987)-318172). The feature of the above invention resides in injection of positive holes into a floating gate for erasure by applying a negative voltage to a control gate. The principle of the erasing operation is based on that, when a negative voltage is applied to the control gate, the withstand voltage of the gated junction is lowered, and application of a drain voltage in such state causes breakdown in the vicinity of the drain immediately below the floating gate. Then the holes resulting from such breakdown are injected into the floating gate by the electric field generated due to the negative voltage applied to the control gate, whereby desired erasure is carried out. And according to the above invention, there are attainable a variety of advantages including that bit-by-bit erasure is rendered possible by applying a negative voltage merely to one word line WL (selected word line) alone. Consequently, there can be predicted requirements for developing an improved EPROM address decoder circuit so contrived as to execute electrical erasure. The address decoder circuit adapted to meet such requirements was accomplished by the present inventor and disclosed in the specification with the accompanying drawing (FIG. 3) attached to the above application. FIG. 9 shows address input MOS transistors included in such circuit.

In FIG. 9, Q4-Q7 denote N-channel address input MOS transistors to receive address signals, and Q8 denotes a P-channel MOS transistor serving as load means for the transistors Q4-Q7. An output signal $V_{N1}$ of a decoding portion consisting of the transistors Q4-Q8 is inverted by a CMOS inverter consisting of transistors Q9 and Q10, and then is transmitted to a word line WL via a MOS transistor Q11 and a transfer P-channel MOS transistor Q1. The transistor Q11 driven by an inverted signal of an erase signal Erase and is turned off during an erase mode but is turned on to conduct during any other operation mode. Denoted by Q12 is a MOS transistor connected between the node of the transistors Q11, Q1 and the output point of the decoding portion consisting of the transistors Q4-Q8. This transistor Q12 is driven by the erase signal Erase in a manner to be turned on during an erase mode and serves to invert the logic of a voltage $V_{N2}$.

There are also shown transistors Q14 and Q15 which constitute a CMOS inverter for inverting the voltage $V_{WL}$ of the word line WL, wherein the output of such CMOS inverter is applied to the gate of a P-channel MOS transistor Q13 connected between a variable power terminal (Vpp/Vcc) and the word line WL. The circuit consisting of Q13-Q15 selectively switches the voltage of the word line WL to Vpp during a write mode or to Vcc during a read mode.

There are further shown transistors Q2 and Q3 to constitute a charge pump for generating a negative voltage, and a capacitor C1 for the same purpose. The earth terminal of the charge pump is grounded via a MOS transistor Q16 driven by the erase signal Erase. Denoted by NOR1 is a nor circuit which receives an erase pulse at one input terminal thereof while receiving the voltage $V_{WL}$ of a word line WL at the other input terminal thereof, and its output terminal is connected to one end of the capacitor C1 partially constituting the charge pump. Strictly speaking, FIG. 9 also includes a negative voltage generator circuit in addition to the address decoder circuit.

Table 1 shown below represents the voltages attained at the nodes in individual operation modes.

TABLE 1

|  | Read | | Write | | Erase | |
| --- | --- | --- | --- | --- | --- | --- |
|  | Sel | Non-sel | Sel | Non-sel | Sel | Non-sel |
| Vpp/Vcc | 5 V | 5 V | Vpp | Vpp | 5 V | 5 V |
| $V_{N1}$ | 0 V | 5 V | 0 V | 5 V | 0 V | 5 V |
| $V_{N2}$ | 5 V | 0 V | Vpp | 0 V | 0 V | 5 V |
| $V_{WL}$ | 5 V | Vthp | Vpp | Vthp | ⊖ | 5 V |
| Source | 0 V | 0 V | 0 V | 0 V | Fl | Fl |
| Erase | 0 V | 0 V | 0 V | 0 V | 5 V | 5 V |

In Table 1: Sel stands for selection; Non-sel for non-selection; and Vpp/Vcc for Vpp/Vcc terminal in row. For example, Vpp is 12.5 volts, and Vcc is 5 volts. Source means that of a memory cell array; Vthp is the threshold voltage of a p-channel MOS transistor Trl; θ (minus sign enclosed with circle) denotes a negative voltage; and Fl means floating. A voltage of 5 volts may be used in place of the floating Fl.

In the row decoder circuit of FIG. 9, during an erase mode, the transistor Q11 is turned off while the transistor Q12 is turned on so that the logic values are inverse to those in any operation mode other than the erase mode. The voltage $V_{N2}$ is set to 0 volt in a selection state or to +5 volts in a non-selection state, whereby the voltage $V_{WL}$ of the word line WL in the selection state can be of a negative value.

FIG. 13 shows another conventional address decoder circuit where a variable supply voltage Vpp/Vcc is applied to a logic gate portion consisting of address input MOS transistors Q1-Qn and a load MOS transistor Ql. This example is introduced in "1988 ISSCC Digest", pp. 120-121. According to the above, the source of the load MOS transistor Ql is connected to the variable power terminal (Vpp/Vcc) in the same manner as the power terminal of the buffer Bu, so that the powerful pullup function can be performed by the load MOS transistor Ql itself. It is therefore not necessary to provide any pullup MOS transistor. In addition to such non-necessity of a pullup MOS transistor, there occurs no potential difference between the power terminal for the buffer Bu and the power terminal for the load MOS transistor, so that no current comes to flow between the two power terminals. Consequently any transfer gate is not needed either. Thus, the address decoder circuit shown in FIG. 13 requires the least number of component elements and is therefore superior with regard to this point.

In a non-volatile memory such as PROM, EPROM or the like, it is necessary, during a writing operation, to apply a voltage Vpp (e.g. 12 volts) higher than a normal supply voltage Vcc (e.g. 5 volts) to a word line of a memory cell array. It is therefore customary to incorporate in the non-volatile memory a voltage supply circuit which receives both voltages Vcc and Vpp and selectively outputs Ypp during a write mode or outputs Vcc in any other operation mode such as a read mode or a standby mode.

FIG. 18 shows a first conventional example of such voltage supply circuit, wherein, when outputting the writing supply voltage Vpp, it is boosted by means of a voltage multiplier and then is outputted via a MOS transistor Qa. This technique is disclosed in William ip et al., "256 Kb CMOS EPROM", ISSCC 84 DIGEST, pp. 138-139 (particularly FIG. 2 thereof). Multiplying the supply voltage Vpp is effective to avert a level reduction corresponding to the threshold voltage of the MOS transistor Qa. In the above example, a writing voltage of 17 volts is obtained by boosting a supply voltage Vpp of 12 volts. In the circuit where a reading voltage Vcc is outputted via a MOS transistor Qb, a control signal (inverted signal of a write command signal PGM) received at the gate of such MOS transistor Qb is the same in level as the supply voltage Vcc. Consequently there occurs a level reduction corresponding to the threshold voltage, and the output voltage becomes Vcc−Vth (where Vth is the threshold voltage of the MOS transistor Qb).

FIG. 19 shows a second conventional example of such voltage supply circuit, wherein a write command signal PGM is converted from the Vcc level to the Vpp level and then is applied to the gate of a MOS transistor Qa. This technique is disclosed in S. Tanaka et al., "A Programmable 256B CMOS EPROM With On Chip Test Circuits", ISSCC 84 DIGEST, pp. 148-149 (particularly FIG. 5 thereof). There are included MOS transistors Qc and Qd constituting a CMOS inverter to invert the signal PGM; a MOS transistor Qe serving as a transfer gate; CMOS transistors Qf and Qg constituting a level converter; and a pullup MOS transistor Qh. In this voltage supply circuit, the control signal PGM applied to the MOS transistor Qa is converted from the Vcc level to the Vpp level by means of a level converter, so that the switching speed can be increased. However, with regard to each of the voltages Vpp and Vcc, there occurs a level reduction corresponding to the threshold voltage of the MOS transistors Qa and Qb.

In a third conventional example of FIG. 20, MOS transistors Qa and Qb for outputting voltages Vpp and Vcc are composed of p-channel type instead of n-channel type so as not to cause the level reduction corresponding to the threshold voltage of the MOS transistors Qa and Qb. Such technique is disclosed in Hideharu Toyomoto et al., "Fast CMOS EPROM of Low Power Consumption with Large Capacity of 138 Kbits", Mitsubishi Technical Report Vol. 59, No. 3, 1985, pp. 61-64 (particularly FIG. 4 thereof) in the above voltage supply circuit, each of the MOS transistors Qa and Qb (and n-channel MOS transistor Qb') are controlled by flip-flop circuits FF1 and FF2.

FIG. 21 shows a fourth conventional example of a voltage supply circuit, wherein a supply voltage Vpp is boosted by voltage multiplier means (charge pump) similarly to the foregoing example of FIG. 18. It is therefore possible to avert the level reduction corresponding to the threshold voltage of a MOS transistor Qa. A boosting charge pump CP driven during a read mode is disposed proximate to the gate of the MOS transistor Qb which receives a control signal and produces an output voltage Vcc. And during a read mode, the level of the control signal fed to the gate of the MOS transistor Qb is raised to be higher than the supply voltage Vcc by a value more than the threshold voltage, so that the voltage Vcc can be outputted without a level reduction corresponding to the threshold voltage.

The example of FIG. 9 represents an address decoder circuit for a PROM where electrical erasure is possible. Concerning the capability of electrical erasure, this example is different from any of those shown previously in FIGS. 5 through 8. However, this address decoder circuit still has a disadvantage that the component elements thereof are numerically great.

Differing from the foregoing examples of FIGS. 6 and 7 where the decoding portion can be constituted of the MOS transistors for the 5-volt system, the address decoder circuit of FIG. 13 is so formed that the MOS transistors Ql, Qn and so forth constituting the decoding portion are to be those for the Vpp (12-volt) system. And in the MOS transistors for the 12-volt system, as compared with those for the 5-volt system, the gate length needs to be increased to form an LDD structure.

Furthermore, since the current flowing in the load MOS transistor Ql becomes extremely great during a write mode, the channel of each of the MOS transistors constituting the decoding portion needs to be widened as compared with the address decoder circuits shown in FIGS. 5 through 7. That is, the gate-source voltage $V_{GS}$ of the load MOS transist or Ql is −12 volts at the variable supply voltage of 12 volts and changes to 5 volts when the supply voltage is 5 volts. Therefore, comparing the values obtained by subtracting the threshold voltage (e.g. 1 volt) of the MOS transistor Ql from such gate-source voltages $V_{GS}$, the ratio becomes 11:4 (12 - 1: 5 - 1). Since the current flowing in the transistor Ql is substantially proportional to the square of the value obtained by subtracting the threshold voltage from the gate-source voltage $V_{GS}$, the ratio of the currents flowing therein becomes 121:16. It follows that the current flowing during the writing operation reaches substantially 7.5 times the values during the reading operation. Consequently, in a selection state during the writing operation, the level needs to be lowered, by the address signal input MOS transistors Ql-Qn, at the input point of the buffer Bu charged with the current 7.5 times greater than the current in the reading operation. Therefore, the channel of each of the MOS transistors Ql-Qn must be widened several times that of each of the MOS transistors Ql-Qn shown in FIGS. 5 through 7. Otherwise the high-speed operation fails to be performed.

Consequently it becomes necessary to increase the dimensions of the MOS transistors constituting the decoding portion of the address decoder circuit shown in FIG. 13, so that the desired high integration density is not exactly attainable although the component elements may be numerically decreased.

Furthermore, an extreme increase of the current flowing in the load MOS transistor Ql during the write mode is not desirable since it brings about augment of the power consumption, as well as a rise of the low-level voltage at the input point of the buffer Bu by reason that such rise causes a leakage current in the buffer Bu.

According to the voltage supply circuit shown in FIG. 18, the control signal for the multiplied supply voltage Vpp is fed to the drain and source of the MOS transistor Qa so that the writing voltage Vpp is obtained therefrom. Consequently the desired high writing voltage Vpp can be produced without causing any level reduction of the MOS transistor Qa. However, since the load current flowing during the writing operation (current required for charging a word line) comes to directly flow in the voltage multiplier means such as charge pump, its boosting circuit needs to be formed with a great capacity and large dimensions. As a result, the power consumption in the voltage multiplier is so increased as to be nonnegligible. Thus, there exists a problem in the voltage supply circuit of FIG. 18 that the voltage multiplier must be burdened with the entirety of the load current during the writing operation. The MOS transistor Qb for outputting the reading voltage Vcc receives the supply voltage Vcc at its drain, and the signal level at the gate thereof becomes the same as the level of the supply voltage Vcc, so that the voltage outputted has a level reduction corresponding to the threshold voltage of the MOS transistor Qb as compared with the supply voltage Vcc. That is, with regard to the reading voltage Vcc, no device is prepared for the level reduction corresponding to the threshold voltage of the MOS transistor.

In the next voltage supply circuit of FIG. 19, there is not incorporated any voltage multiplier and, concerning the supply voltage Vpp, a control signal PGM inputted to the gate of the MOS transistor Qa is merely converted from the Vcc level to the Vpp level. Consequently the writing voltage outputted becomes lower than the received supply voltage Vpp by a value corresponding to the threshold voltage of the MOS transistor Qa. That is, no contrivance is existent at all for feeding a programmed supply power from an external circuit to the control gate so as to enhance the writing efficiency without causing any level reduction. With respect to the supply voltage Vcc also, there occurs a level reduction corresponding to the threshold voltage of the MOS transistor Qb.

According to another conventional voltage supply circuit shown in FIG. 20, a positive supply voltage is taken out by the use of p-channel MOS transistors Qa and Qb, so that there occurs no level reduction corresponding to the threshold voltage differently from the foregoing case of using an n-channel MOS transistor. However, this circuit has another problem that latch-up may be induced due to noise and so forth. Now this problem will be described below with reference to FIG. 22. In an EPROM where a p-type semiconductor substrate is employed, p-channel MOS transistors Qa and Qb are formed in an n-type semiconductor well. Therefore the back gates of the MOS transistors Qa and Qb are connected to the terminal having a higher potential, i.e. to the Vpp terminal. Thus, the MOS transistors Qa and Qb are so constituted as shown in FIG. 22. This diagram includes a p-type semiconductor substrate $\underline{a}$; an n-type semiconductor well $\underline{b}$ formed selectively in the surface region of the semiconductor substrate $\underline{a}$; and p-channel MOS transistors Qa and Qb formed in such well $\underline{b}$.

The source of the MOS transistor Qb receives the voltage Vcc, and normally the potential thereof is lower than that of the well $\underline{b}$ where the voltage Vpp is received. However, due to some noise or supply voltage fluctuation, there may occur an occasion where the source of the MOS transistor Qb has a potential higher than that of the well $\underline{b}$. And in case the source potential of the MOS transistor Qb becomes higher than the potential of the well $\underline{b}$ by a value corresponding to the forward voltage (0.6 to 0.7 volt) at the pn junction, it follows that a great current comes to flow in a junction diode D formed between the source and the well. Then such current triggers flow of an amplified current in a parasitic transistor Q of pnp type whose emitter, base and collector are composed respectively of the source of the MOS transistor Qb, the well $\underline{b}$ and the substrate $\underline{b}$. The parasitic transistor Q is naturally turned on when the potential of the emitter or the MOS transistor Qb becomes higher than the potential of the base or the well $\underline{b}$ by more than the forward voltage. It follows therefore that a current comes to flow from the Vcc terminal to the ground (substrate $\underline{a}$) corresponding to the collector of the parasitic pnp transistor. Since latch-up may be caused in the manner described, a disadvantage is existent in the voltage supply circuit of FIG. 20 where the constitution is so restricted that the power sources connected directly to external pins are spaced apart from each other by the pn junction alone between the well and its internal semiconductor region.

In a further conventional voltage supply circuit of FIG. 21, the individual charge pumps are used so as not to induce any level reduction corresponding to the threshold value of the MOS transistor with respect to each of the voltages Vpp and Vcc. As far as this point is concerned, the circuit of FIG. 8 is considered to be superior. However, there still exists a disadvantage that the charge pump for lowering the Vpp level must be burdened with the entire load current in the voltage supply circuit during the writing operation similarly to the foregoing example of FIG. 18. Meanwhile the charge pump CP for preventing a level reduction of the voltage Vcc is not in operation during a standby mode, so that the voltage Vcc outputted from the voltage supply circuit during a standby mode has a level reduction. Consequently it is unavoidable that, when the standby mode kept on relatively long is switched over to a read mode, shortage of the control voltage occurs transiently.

Thus, it has been impossible heretofore to eliminate the level reduction of the supply voltage corresponding to the threshold voltage of the MOS transistor, without bringing about instability of the operation, necessity of a voltage multiplier having a large current capacity, and increase of the power consumption.

OBJECTS AND SUMMARY OF THE INVENTION

The present invention has been accomplished in view of the problems mentioned hereinabove. And an object of the invention resides in providing an improved address decoder circuit which realizes electrical erasure in a non-volatile memory without increasing the number of its component elements.

Another object of the invention is to provide an improvement which is capable of reducing the power consumption in the writing operation and is adapted to minimize the size of component elements.

And a further object of the invention is to provide an improved voltage supply circuit which is capable of outputting a first voltage without causing any level reduction while averting additional connection of any circuit that consumes a great power.

The address decoder circuit for a non-volatile memory according to the present invention is so contrived that, for the purpose of solving the problems mentioned, the direction of application (polarity) of a supply voltage during an erasing operation to a decoding portion consisting of a load MOS transistor and address input MOS transistors is rendered different from that during a writing or reading operation (in a manner that the polarity is inverted), and a third potential is applied to the power terminal (second terminal) proximate to the address input MOS transistor and also to the power terminal (third terminal) of the buffer so as to prohibit erasure, whereby the third potential for preventing erasure is outputted in the state of non-selection.

Another feature of the present invention is that the circuit is so contrived as to increase the resistance of load means in a writing operation.

And a further feature of the invention is such that a MOS transistor for outputting a first voltage is controlled in response to a signal obtained by boosting a control signal through voltage multiplier means.

According to the address decoder circuit of the present invention for a non-volatile memory, the output is fed in a selection state during a reading or writing operation but is not fed in a non-selection state; meanwhile no output is fed in a selection state during an erasing operation, hence permitting application of a negative voltage to a word line. Consequently it becomes possible to perform erasure by the negative voltage, and further to prevent erasure by applying a third potential to the word line in a non-selection state, thereby achieving bit-by-bit erasure.

The output logic is inverted in the writing/reading operation and the erasing operation by changing the potential applied to the power terminals at the two ends of the circuit consisting of the load MOS transistor and the address input MOS transistors, so that electrical erasure is still attainable by forming the address decoder circuit merely of the buffer and the decoding portion (logic gate portion) consisting of the load MOS transistor and the address input MOS transistors. It becomes therefore possible to realize desired electrical erasure without numerically increasing the component elements of the address decoder circuit.

Furthermore, the resistance of its load means is increased during the writing operation so that, even when the supply voltage becomes higher, the current flowing in the load means is not increased at all or is increased merely slightly during the writing operation. Consequently, any wasteful augment of the power consumption can be prevented.

Since the current flowing in a write mode is not exactly far greater than that in a read mode, it is possible to avert the necessity of enlarging the size of the load means and each of the MOS transistors to eventually attain reduction of the area occupied by the address decoder circuit, hence giving a contribution to high integration density of the memory.

And according to the voltage supply circuit of the present invention, a control signal used for controlling a MOS transistor is merely boosted by means of a voltage multiplier, and such multiplier is not burdened with the output current of the voltage supply circuit. Therefore the control signal alone flows in the voltage multiplier to consequently minimize the required output current of such multiplier. As a result, there exists none of the known disadvantages that a large area is occupied by the voltage multiplier or a great power is consumed by the same.

DESCRIPTION OF THE PREFERRED EMBODIMENTS

Hereinafter the address decoder circuit of the present invention for a non-volatile memory will be described in detail with reference to its preferred embodiments shown in the accompanying drawings.

Figure 1:
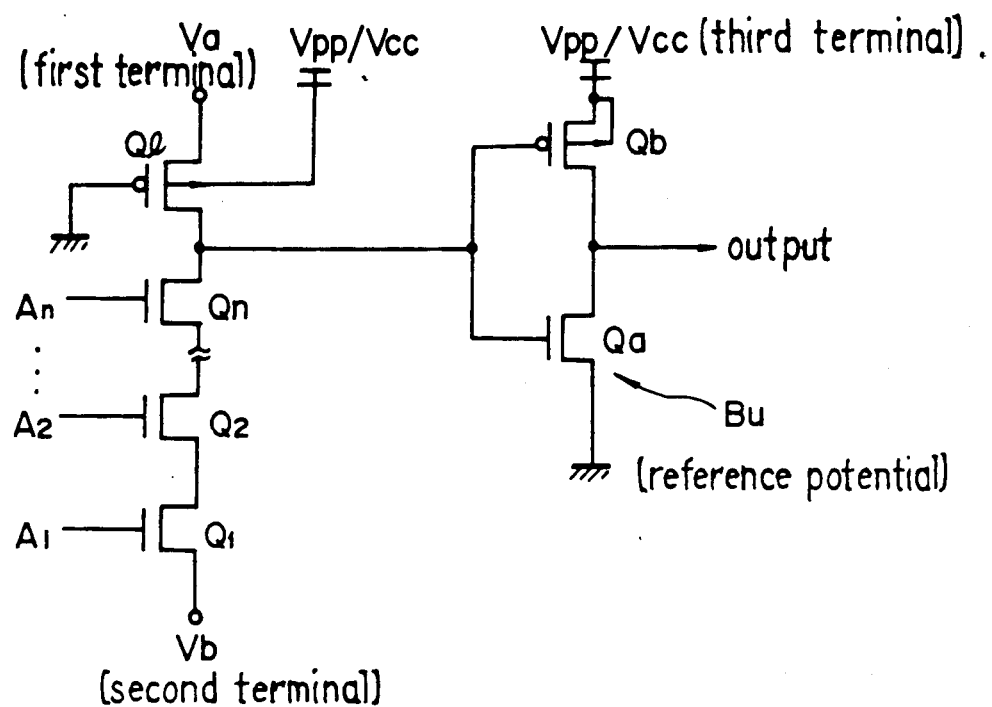
FIG. 1 is a circuit diagram showing an exemplary embodiment of the address decoder circuit of the present invention for a non-volatile memory.

FIG. 1 is a circuit diagram showing an exemplary embodiment of the non-volatile memory address decoder circuit according to the present invention. In this diagram, Q1, Q2 . . . Qn denote address input MOS transistors of n channels connected in series with one another to receive address signals. The source of the address input MOS transistor A1 at one end of such series circuit is connected to a second terminal Vb.

Denoted by Ql is a p-channel load MOS transistor whose drain is connected to the drain of the address input MOS transistor Qn at the other end of the series circuit consisting of the address input MOS transistors Q1, Q2 . . . Qn. The source of the load MOS transistor Ql is connected to a first terminal Va while the gate thereof is grounded, and the channel region is connected to a third or variable power terminal (Vpp/Vcc).

A buffer Bu composed of a CMOS inverter consists of a p-channel MOS transistor Qa and an n-channel MOS transistor Qb. Its input terminal is connected to the node of the address input MOS transistor Qn and the load MOS transistor Ql. Meanwhile the source of the p-channel MOS transistor Qb is connected to the third or variable power terminal (Vpp/Vcc), and the source of the n-channel MOS transistor Qa is grounded.

The potential Va at the first terminal is selectively changed to Vcc (e.g. 5 volts) during a read mode, Vpp (e.g. 12 volts) during a write mode, and to a reference potential (0 volt) during an erase mode. The potential Vb at the second terminal is selectively changed to 0 volt during a read or write mode and to Vcc during a read mode. Meanwhile the potential at the third or variable power terminal (Vpp/Vcc) is selectively changed to Vcc during a read mode, Vpp during a write mode, and to Vcc during an erase mode.

Table 2 shown below represents the changes of the potentials at the individual terminals.

TABLE 2

|  | Va | Vb | Vpp/Vcc |
|---|---|---|---|
| Read | Vcc | 0 V | Vcc |
| Write | Vpp | 0 V | Vpp |
| Erase | 0 V | Vcc | Vcc |

Thus, during a read mode in the address decoder circuit, the potential at the first terminal Va is Vcc, the potential at the second terminal Vb is 0 volt, and the potential at the third or variable power terminal (Vpp/Vcc) is Vcc, so that Vcc is outputted in a selection state or 0 volt is outputted in a non-selection state. Meanwhile during a write mode, merely the level at the variable power terminal is changed to Vpp as compared with a read mode, and Vpp is outputted in a selection state or 0 volt is outputted in a non-selection state.

During an erase mode, the first terminal Va is changed to 0 volt, the second terminal Vb to Vcc, and the third or variable power terminal to Vcc, respectively. Therefore, the output of the address decoder circuit becomes 0 volt in a selection state or Vcc in a non-selection state. That is, the logic of the buffer output during an erase mode is reverse to that during a read or write mode. Describing the above more specifically, the second terminal Vb is changed to Vcc during an erase mode while the first terminal Va is changed to 0 volt, so that in a selection state (where the entire address input MOS transistors Ql-Qn are turned on), the decoding portion has a potential Vcc-Vthn (in which Vthn denotes the threshold voltage of the address input MOS transistor), whereby the output of the buffer Bu is turned to 0 volt. And in a non-selection state (where at least one of the address input MOS transistors Ql-Qn is turned off), the output of the decoding portion is changed to 0 volt ~|Vthp| (in which Vthp denotes the threshold voltage of the load MOS transistor), so that the output of the buffer Bu is turned to Vcc. The above is achievable with facility by setting the impedance ratio of the load MOS transistor Ql and the address input MOS transistors Ql-Qn to a proper value in the stage of designing the circuit. The reason for setting the output not to 0 volt but to a higher voltage Vcc (or Vpp) in a non-selection state is based on the purpose of preventing erasure of any non-selected word line. The principle for prevention of erasure attained by setting the output to Vcc (or Vpp) will be understood clearly from the following description given later with regard to the circuit of FIG. 4.

Table 3 shown below represents the outputs of the address decoder circuit in a selection state and a non-selection state during read, write and erase modes respectively.

TABLE 3

|  | Selection | Non-selection |
|---|---|---|
| Read | Vcc | 0 V |
| Write | Vpp | 0 V |
| Erase | 0 V | Vcc |

Figure 2:
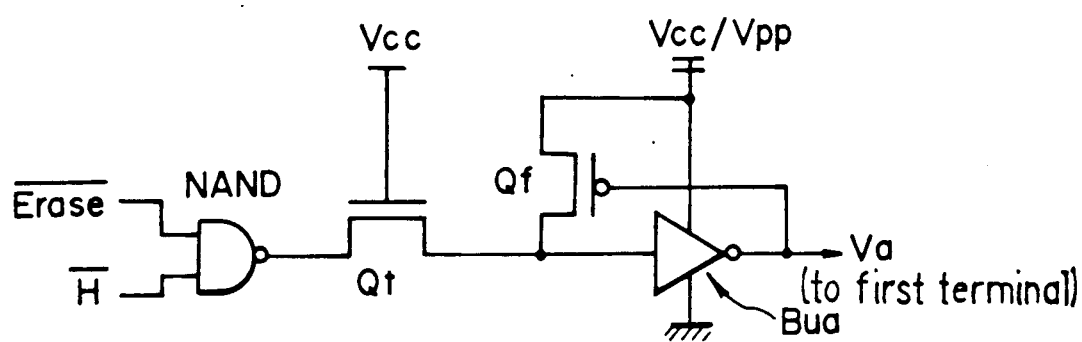
FIG. 2 is a circuit diagram of an exemplary level controller for controlling the level at a first terminal.

FIG. 2 is a circuit diagram of an exemplary level controller for controlling the potential (level) at the first terminal (source of the load MOS transistor Ql in the address decoder circuit). Denoted by NAND is a nand circuit which receives an inverted signal of an erase signal Erase at its one terminal and also receives, at its other terminal, a signal obtained by inverting a signal used to command selection of the entire word lines (entire outputs H). The output of the nand circuit NAND is fed via an n-channel MOS transistor Qt, which serves as a transfer gate, to a buffer Bua consisting of a CMOS inverter. The output terminal of such buffer Bua corresponds to the first terminal Va. Denoted by Qf is a pullup p-channel MOS transistor.

According to the circuit of FIG. 2, the output Va can be turned to 0 volt during an erase mode or to Vpp (during a write mode) or Vcc (during a read mode). However, also when there is generated a signal for selection of the entire word lines, the output Va is turned to 0 volt. Selection of the entire word lines is necessary at the time of a test as well, and in such a case the output of the nand circuit NAND is turned to a high (H) level so that the output Va of the buffer Bua becomes 0 volt. Then the output of the address decoder circuit (FIG. 1) is turned to either Vpp (during a write mode) or Vcc (during a read mode), whereby simultaneous reading or writing operation can be performed. Although there may exist the necessity of placing the entire word lines in a non-selection state for testing or the like, the desired condition can be achieved by controlling the address signal in such a manner as to turn off one of the address input MOS transistors Ql-Qn in the address decoder circuit. That is, such control is executed by turning one of the input address signals, which are fed to the address decoder circuit, to a low (L) level with respect to the entirety of the row address decoder circuits. Placing the entire word lines in a non-selection state may also be executed by raising the level of the second terminal Vb independently of the address signals. However, considering the cut of the direct current in a standby state and the switching speed from such standby state to the active state, it is supposed better to adopt the means of realizing the non-selection state of the entirety by the use of address signals.

Figure 3:
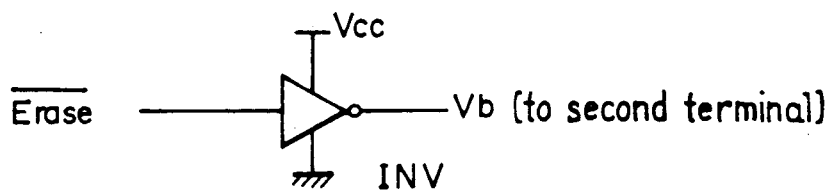
FIG. 3 is a circuit diagram of an exemplary level controller for controlling the level at a second terminal.

FIG. 3 shows a circuit diagram of a level controller employed for controlling the potential (level) at the second terminal (source of the address input MOS transistor Ql in the address decoder circuit). In this controller, the signal formed by inverting the erase signal Erase is inverted again by an inverter INV.

Figure 9:
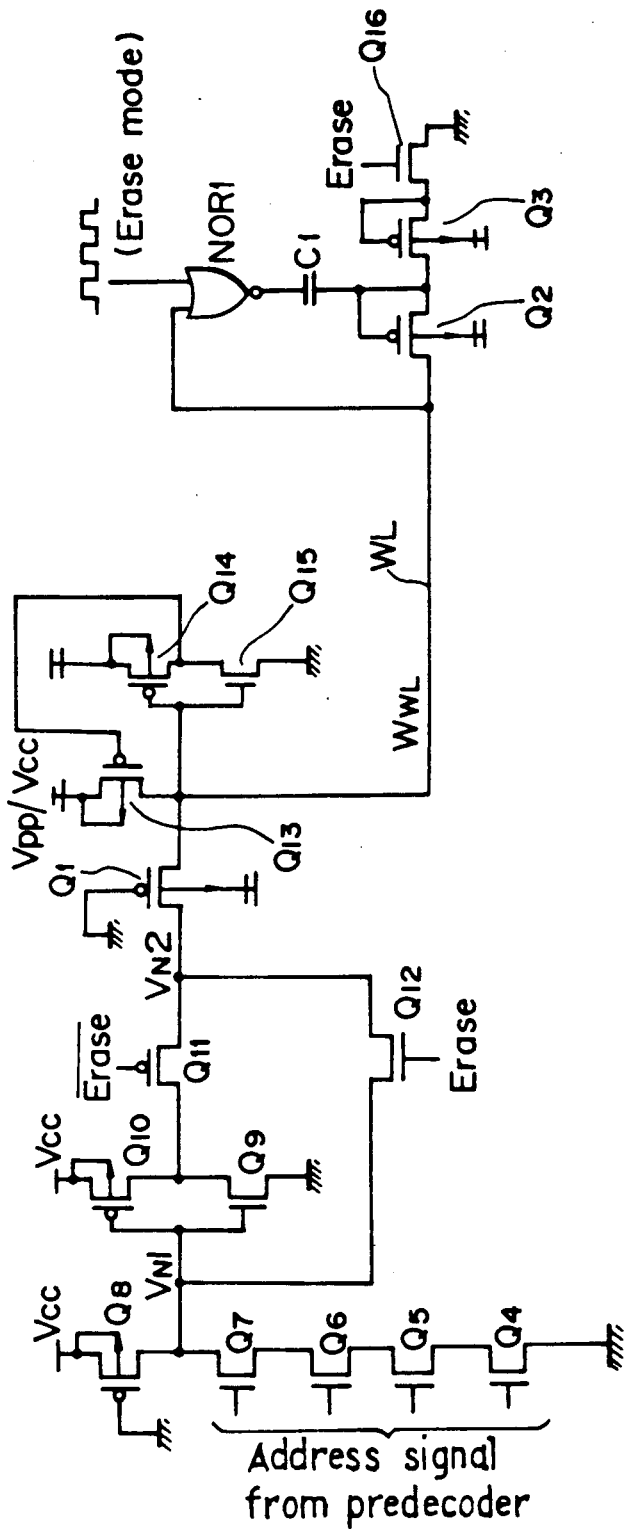
FIG. 9 is a circuit diagram of the address decoder circuit developed previously by the present inventor.

The non-volatile memory using the above address decoder circuit needs the level controller of FIG. 2 and the level controller of FIG. 3. However, it is not exactly necessary to provide a pair of such controllers for each address decoder circuit, and the constitution may be so modified as to provide merely one pair of them for the entire address decoder circuits. Therefore the necessity of such level controllers causes no impediment with respect to enhancing the integration density. The address decoder circuit of FIG. 9 developed previously requires a load MOS transistor, address input MOS transistors, a buffer and further MOS transistors Q11, Q12, Q13, Q14 and Q15, so that many component elements are used per circuit. However, according to the address decoder circuit of the present invention, there is required, besides a load MOS transistor and address input MOS transistors and a buffer Bu, merely a MOS transistor Qc which serves as a transfer gate in a circuit of FIG. 4 (which will be described later), and consequently the number of required component elements per address decoder circuit is reduced.

Figure 4:
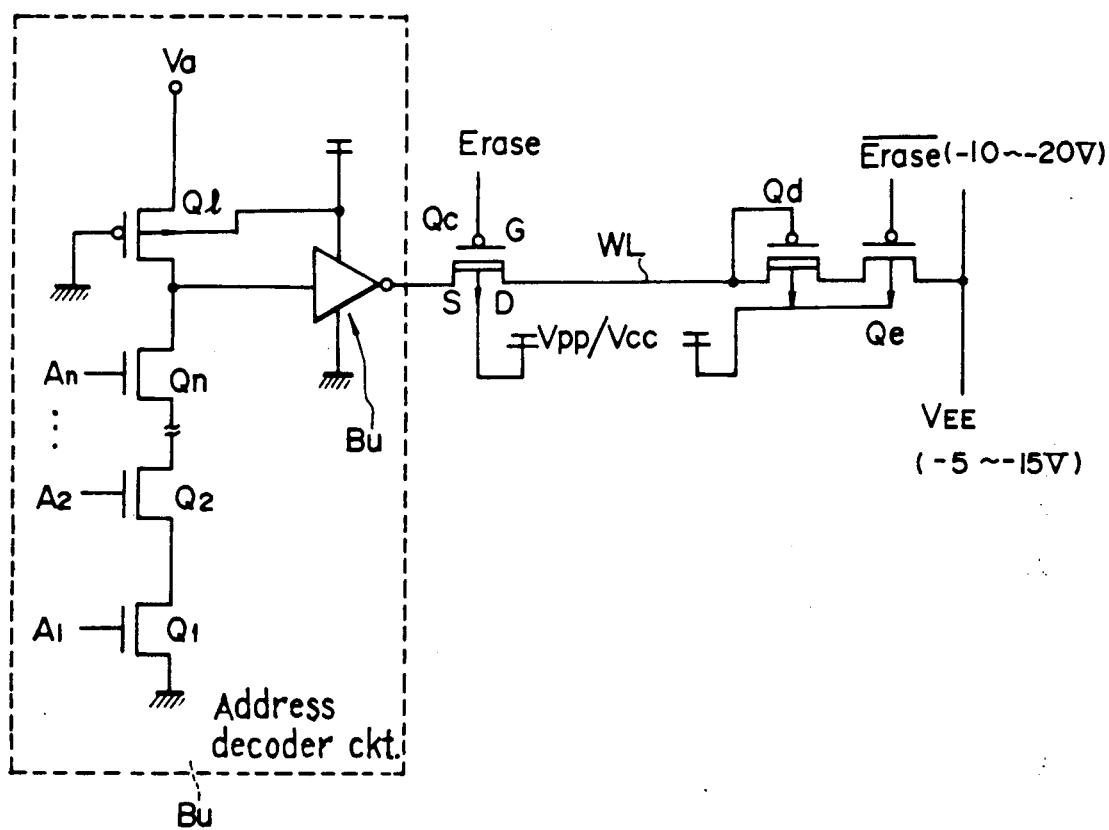
FIG. 4 shows a circuit for applying a negative voltage to a word line.
Figure 5:
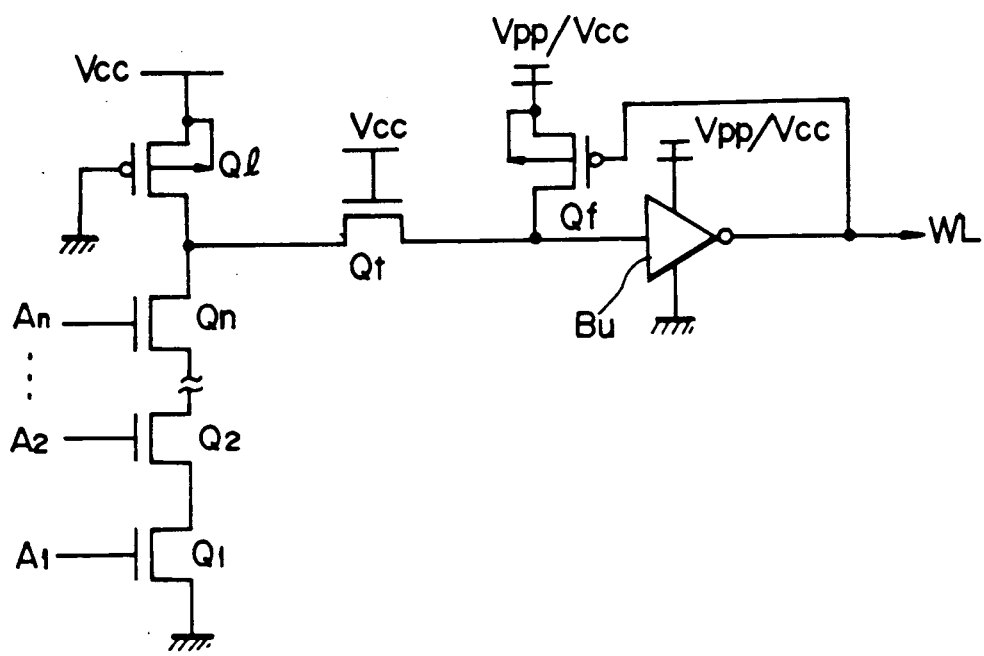
FIG. 5 is a circuit diagram of a first conventional example.
Figure 6:
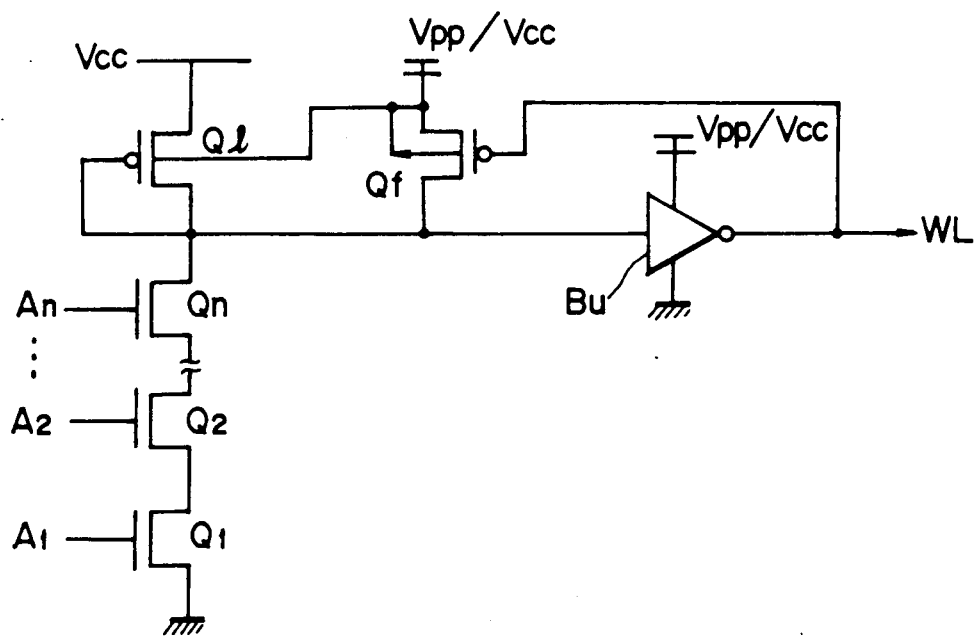
FIG. 6 is a circuit diagram of a second conventional example.
Figure 7:
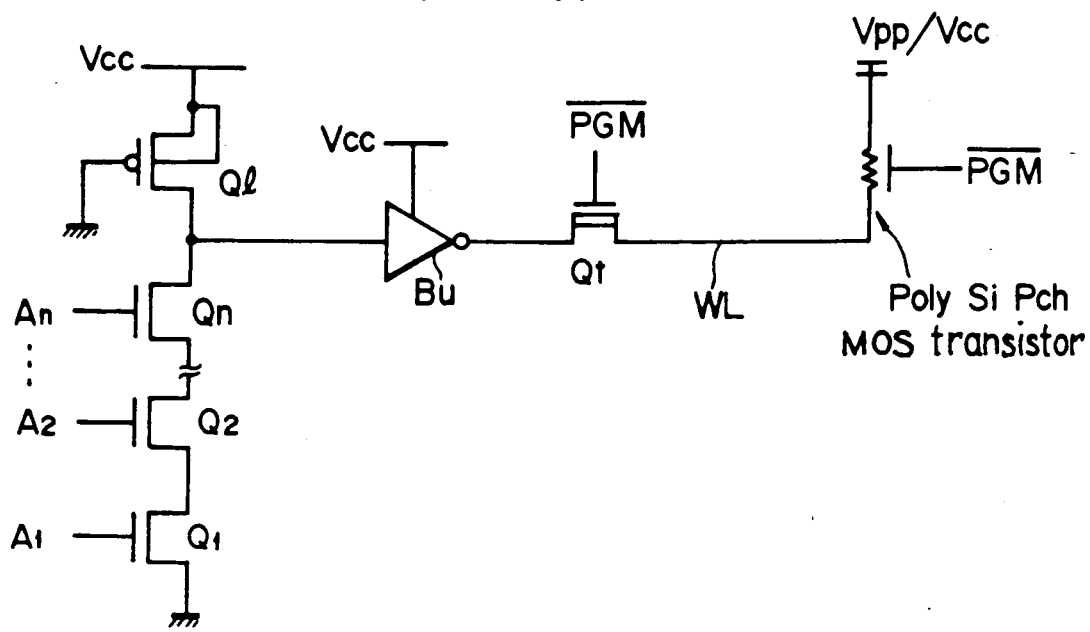
FIG. 7 is a circuit diagram of a third conventional example.
Figure 8:
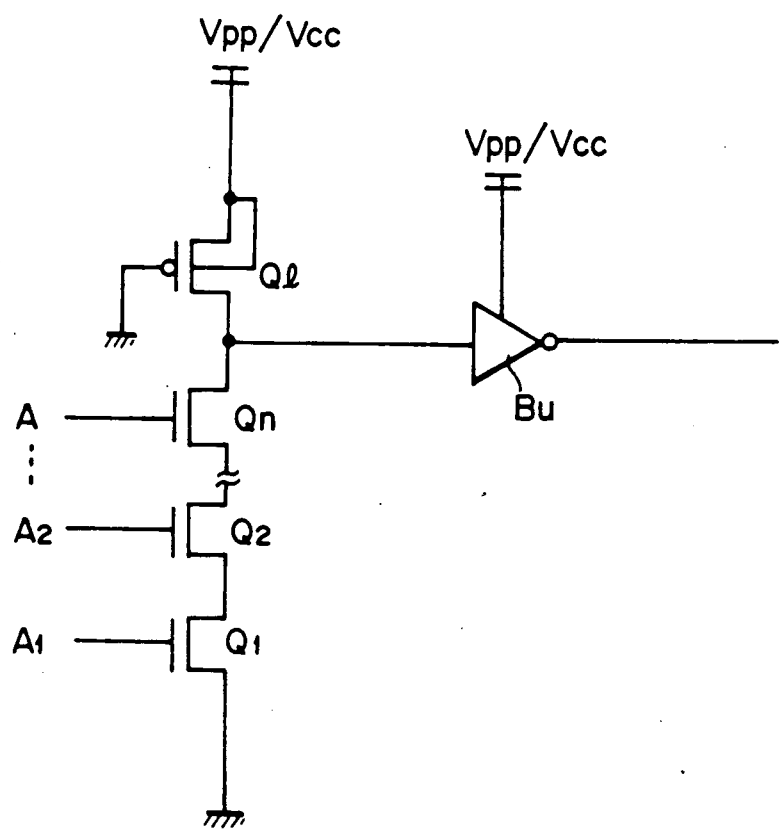
FIG. 8 is a circuit diagram of a fourth conventional example.

FIG. 4 shows a circuit for applying a negative voltage to a word line WL.

In this diagram, Qc denotes a depletion mode p-channel MOS transistor interposed between a buffer Bu of the address decoder circuit and a word line WL. More specifically, such transistor Qc has a source S connected to the buffer Bu, a drain D connected to the word line WL, and a gate G for receiving an erase signal Erase.

There are also shown a depletion mode p-channel MOS transistor Qd, and an ordinary (enhancement mode) p-channel MOS transistor Qe. The two MOS transistors Qd and Qe are connected in series with each other, and such series circuit is interposed between the word line WL and the negative voltage supply terminal ($V_{EE}$), wherein the source and the gate of the MOS transistor Qd are mutually connected. And a signal ($-10$ to $-20$ volts) obtained by inverting the erase signal Erase is applied to the gate of the MOS transistor Qe. The negative voltage $V_{EE}$ has a value of, e.g. $-10$ to $-20$ volts and is generated by an unshown circuit in FIG. 4 (for example, a charge pump in FIG. 9). And during an erase mode, the MOS transistor Qe is turned on to conduct so that the $V_{EE}$ line and the word line WL are connected to each other via the MOS transistors Qd and Qe. In any operation mode other than the erase mode, the $V_{EE}$ line and the word line WL are electrically separated from each other.

During an erase mode, the output of the buffer Bu in the address decoder circuit becomes 0 volt in a selection state as mentioned. And in the depletion-mode MOS transistor Qc receiving an erase signal Erase of, e.g. 5 volts, the gate-source voltage becomes 5 volts while the threshold voltage ranges from 2 to 3 volts, so that the transistor Qc is cut off. As a result, the word line WL is disconnected from the address decoder circuit by the MOS transistor Qc and comes to have the negative voltage $V_{EE}$. It signifies therefore that erasure is rendered possible.

In a non-selection state during an erase mode, the output of the buffer Bu is changed to the Vcc level (5 volts), i.e. the gate-source voltage becomes 0 volt which is lower than the threshold voltage, so that the MOS transistor Qc is turned on. Consequently, the word line WL is changed to the Vcc level (5 volts). Thus, the voltage generated by the address decoder circuit in a non-selection state meets the requirement if its value is sufficient merely to cut off the depletion mode MOS transistor Qc serving as a transfer gate, and the value is not exactly limited to Vcc (5 volts) alone. For example, it may be set to Vpp (12 volts) which is higher than Vcc. Table 4 shown below represents the output of the buffer Bu, the state of the MOS transistor Qc and the level of the word line WL.

TABLE 4

|  | Bu | Qc | WL |
| --- | --- | --- | --- |
| Selection | 0 V | OFF | $V_{EE}$ |
| Non-selection | Vcc | ON | Vcc |

It is to be understood that the present invention is applicable also to a circuit employing merely a single address input MOS transistor.

Figure 10:
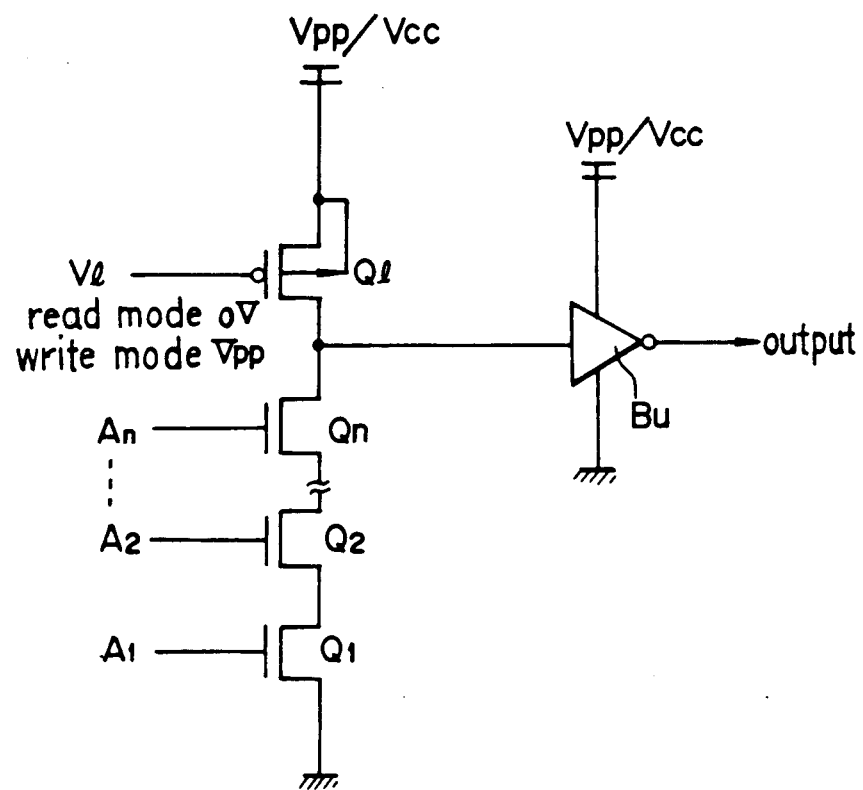
FIG. 10 is a circuit diagram showing another embodiment of the address decoder circuit of the present invention for a non-volatile memory.

FIG. 10 is a circuit diagram showing another exemplary embodiment of the non-volatile memory address decoder circuit according to the present invention.

Denoted by Ql in this diagram is a p-channel MOS transistor whose source is connected to a variable power terminal (Vpp/Vcc) and whose drain is connected to one end of a series circuit consisting of MOS transistors Ql-Qn of n channels (i.e. to drain of MOS transistor Qn). Meanwhile the other end of such series circuit (source of MOS transistor Ql) is grounded. The MOS transistors Ql-Qn receive address signals A1-An respectively.

The node of the MOS transistor Ql and the MOS transistor Qn is connected to the input terminal of a buffer circuit composed of a CMOS inverter. The buffer Bu is driven by the supply voltage received from the variable power terminal (Vpp/Vcc). And the output of the buffer is connected to a word line of a memory cell array.

Figure 13:
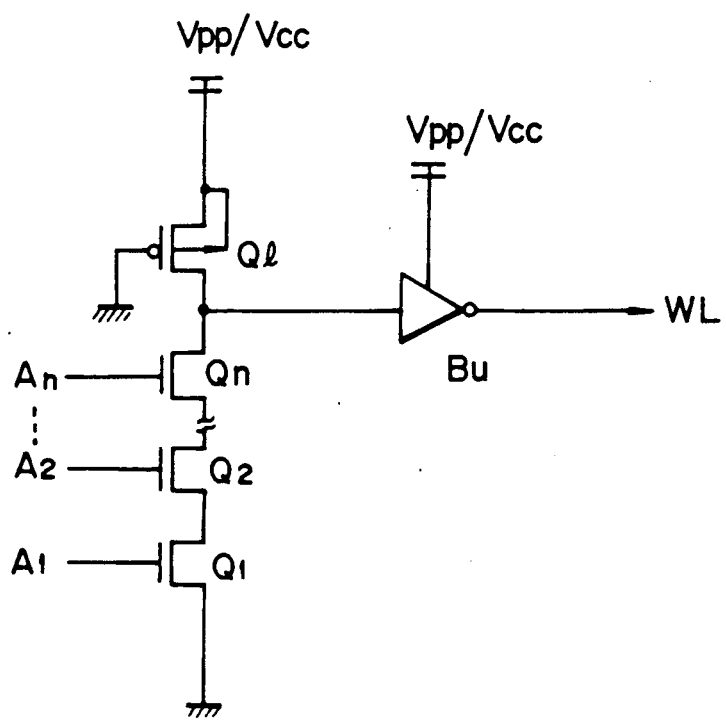
FIG. 13 is a circuit diagram of a fifth conventional exemplary address decoder circuit for a nonvolatile memory.

A control signal V1 inputted to the gate of the load MOS transistor Ql becomes 0 volt during a read mode and is changed, during a write mode, to a considerably higher value such as 5 to 9 volts (on condition that the write voltage Vpp is 12 volts). It is a matter of course that such value needs to be higher than the threshold voltage of the MOS transistor Ql and lower than the supply voltage Vpp. In this manner, the address decoder circuit of the present invention is different from the conventional example of FIG. 13 in the point that, instead of turning the gate of the load MOS transistor Ql to the ground level or 0 volt, the control signal V1 is inputted to the gate so that the gate level is rendered higher during a write mode.

Thus, according to the above address decoder circuit, the gate potential of the load transistor Ql is raised from 0 volt to a range of 5 to 9 volts during a write mode where the source potential thereof is turned to be as high as 12 volts (Vpp), so that the current flowing in the MOS transistor Ql can be maintained at a value equal to or slightly greater than that in a write mode. Consequently it becomes possible to avert the disadvantage that the power consumption increases to be great during the writing operation. Furthermore when the input-side level of the buffer is reduced in a selection state, the current flowing in each of the MOS transistors Ql–Qn can also be decreased, hence eliminating the necessity of widening the channel of each of the MOS transistors Ql–Qn in consideration of the writing operation. Therefore, each of the MOS transistors Ql–Qn is dimensionally reducible to eventually attain a higher integration density in the address decoder circuit.

Figure 11:
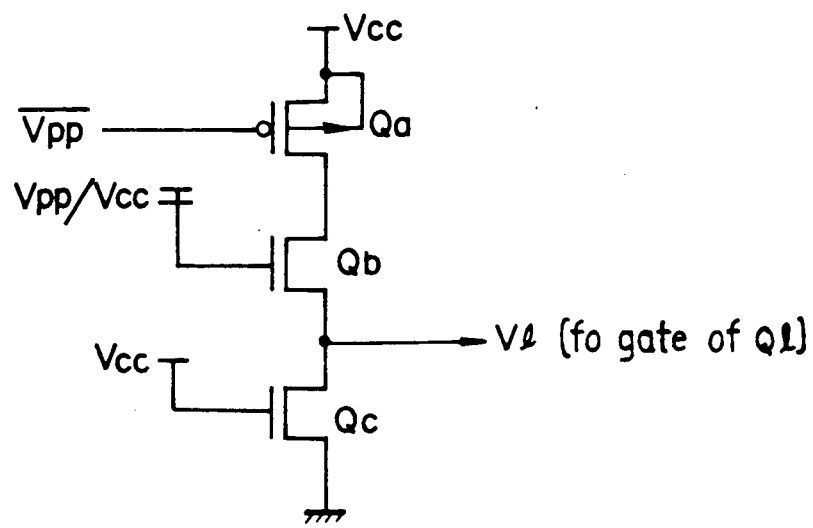
FIG. 11 is a circuit diagram of an exemplary control signal generator.

FIG. 11 shows a circuit diagram of an exemplary control signal generator for generating the aforementioned control signal Vl. In this diagram are included a p-channel MOS transistor Qa, an n-channel MOS transistor Qb and an n-channel MOS transistor Qc which are connected in series with one another. The source of the MOS transistor Qa at one end of such series circuit is connected to a normal power terminal (Vcc, e.g. 5 volts), while the source of the MOS transistor Qc at the other end of the series circuit is grounded. And the MOS transistor Qa receives a signal $\overline{Vpp}$ at its gate. The signal $\overline{Vpp}$ has a level of 5 volts during a read mode and a standby mode but is turned to 0 volt when the variable supply voltage received is Vpp. The gate of the MOS transistor Qb is connected to the variable power terminal (Vpp/Vcc), while the MOS transistor Qc is connected at its gate to the normal power terminal (Vcc) and functions as a fixed resistor. The node of the MOS transistors Qb and Qc serves as an output point which is connected to the gate of the load MOS transistor Ql.

In the above control signal generator, the signal $\overline{Vpp}$ has a level of 5 volts during a read mode and a standby mode to cut off the MOS transistor Qa, whereby its output Vl is turned to 0 volt. Since the MOS transistor Qa is turned on to conduct during a write mode, the output Vl is changed to the level of Vcc (5 volts) which is higher than 0 volt. The gate of the MOS transistor Qb is connected to the variable power terminal (Vpp/Vcc) and is switched to have the voltage Vpp during a read mode, so that the control signal Vl can be outputted by properly selecting the width-to-length ratio W/L of the channel of the MOS transistor Qb while maintaining the condition of Vcc =5 volts without causing any level reduction based on the threshold voltage of the MOS transistor Qb.

The control signal generator is so formed that the level of the control signal Vl is changed gradually in accordance with the gradual change in the potential of an N-type well. Now this point will be described below in detail. The non-volatile memory receives an external supply voltage Vcc of 12 volts and, in response to a switching command signal, places the internal circuit in a state to produce a 12-volt output or in a state to produce a 5-volt output. The n-type semiconductor well has an extremely wide area where the P-channel MOS transistor is formed and the variable power terminal is connected, so that the change caused in the potential thereof becomes more gradual than that in the switching command signal. It is desired therefore that the control signal Vl be changed in conformity with such gradual change in the potential of the semiconductor well. Because, if the control signal Vl of 5 volts is rapidly changed to 0 volt upon termination of the writing operation, the potential of the well fails to change from 12 volts to 5 volts so quickly, whereby an undesirable operating state is induced transiently that a current flows through the element in the well to consequently bring about a level fluctuation.

In the control signal generator, the gate of the MOS transistor Qa is connected to the variable power terminal (Vpp/Vcc) in the same manner as the n-channel well, so that the control signal Vl outputted from the source thereof is changed in conformity with the gradual change from Vcc to Vpp in the well, hence ensuring an advantage with regard to this point also.

Figure 12:
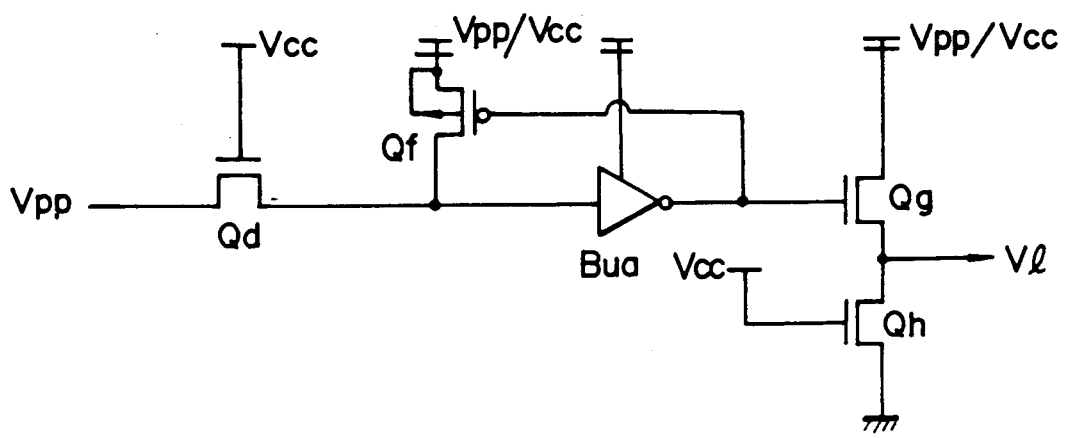
FIG. 12 is a circuit diagram of another exemplary control signal generator.

However, the above control signal generator is capable of changing the control signal Vl merely to 5 volts in the writing operation, and it is impossible to attain sufficient reduction of the current in the load MOS transistor Ql of the address decoder circuit during the writing operation. FIG. 12 shows a circuit diagram of another control signal generator which is capable of maintaining the control signal Vl at a high value of 8 to 9 volts in the writing operation and thereby sufficiently reducing the current in the MOS transistor Ql during the writing operation.

In this diagram, there are included a transfer gate Qd for feeding the output of the buffer Bua back to the input side. The transistor Qf is driven by the supply voltage received from a variable power terminal Vpp/Vcc. MOS transistors Qg and Qh are of n-channel type and are connected in series to each other, wherein the drain of the MOS transistor Qg is connected to the variable power terminal (Vpp/Vcc), while the source of the MOS transistor Qh is grounded, and the source of the MOS transistor Qg is connected to the drain of the MOS transistor Qh to form an output terminal. And the output of the buffer Bua is fed to the gate of the MOS transistor Qg. The MOS transistor Qh functions as a fixed resistor while receiving the supply voltage Vcc at its gate.

In such control signal generator, the input signal of the buffer Bua is turned to a high level during a read mode and a standby mode, while its output signal is turned to a low level to consequently cut off the MOS transistor Qg. Then the control signal Vl is changed to 0 volt. Meanwhile in a write mode, the input signal of the buffer Bua is turned to a low level, so that the gate of the MOS transistor Qg is turned to a high level. Accordingly, the control signal Vl can be set at a value of, e.g. 8 to 9 volts obtained by dividing the voltage Vpp through the two MOS transistors Qg and Qh. Also in the control signal generator of this example, the gate and drain of the MOS transistor Qh are connected via the p-channel MOS transistor of the buffer Bua to the variable power terminal (Vpp/Vcc), and its potential is changed gradually in the same manner as the potential of the N-type well. Therefore the control signal Vl is changed with the same gradualness as the potential of the N-type well in the control signal generator of the foregoing example in FIG. 2, thereby achieving an advantage.

Although the present invention requires a control signal generator as mentioned, it is not necessary to provide one control signal generator for each address decoder circuit, and merely a single control signal generator may be provided for a multiplicity of address decoder circuits. For example, it is completely possible for a single control signal generator to supply a control signal Vl to the entire address decoder circuits in a non-volatile memory. Therefore the necessity of such control signal generator causes substantially no impediment to the advantage of enhancing the integration density.

Figure 14:
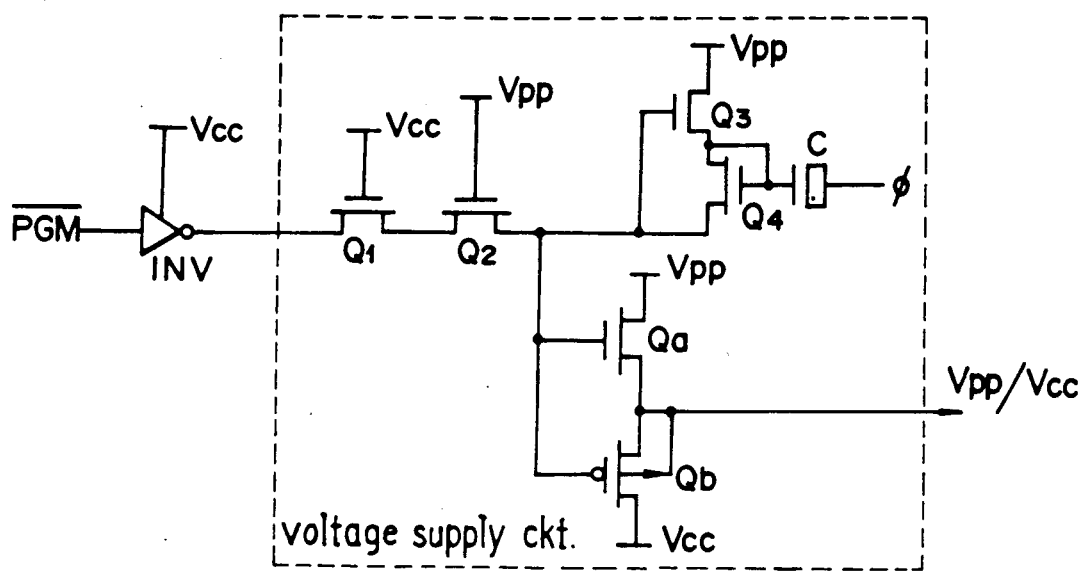
FIG. 14 is a circuit diagram showing a first embodiment of the voltage supply circuit according to the present invention.

FIG. 14 is a circuit diagram showing an exemplary embodiment of the voltage supply circuit according to the present invention.

In this diagram, there are included a MOS transistor Q1 serving as a transfer gate to receive a voltage Vcc at its gate electrodes, and a MOS transistor Q2 serving as a transfer gate to receive a voltage Vpp at its gate electrode, wherein an inverted signal of a write command signal PGM is inverted again by an inverter INV and then is fed via the two-stage transfer gates Q1, Q2 to the gates of the MOS transistors Qa and Qb. The MOS transistor Qa is of n-channel type and is connected between the Vpp terminal and the output terminal of the voltage supply circuit. Meanwhile the MOS transistor Qb is of p-channel type and is connected between the Vcc terminal and the output terminal of the voltage supply circuit.

Denoted by Q3, Q4 and C are MOS transistors and a capacitor constituting a charge pump. And in a write mode, the charge pump receives a boosting pulse $\phi$ and produces an output voltage (about 15 volts in case Vpp is 12 volts) higher than the total voltage of Vpp +Vth (where Vth is the threshold voltage of transistor Qa). In any other operation mode than the write mode, the boosting pulse $\phi$ is not received so that the voltage is not multiplied.

Now the operation of such circuit will be described below. In a standby mode and a read mode, the control signal inputted to the inverter INV is turned to be "high" while the output of the inverter INV is turned to be "low". The output signal of the inverter INV is fed via the transfer gates Q1 and Q2 to the gate electrodes of the MOS transistors Qa and Qb, so that the gate levels of the MOS transistors Qa and Qb become "low". Consequently the n-channel MOS transistor Qa is cut off while the p-channel MOS transistor Qb is turned on to conduct, whereby the supply voltage Vcc received at the source of the MOS transistor Qb is outputted directly. That is, during a read mode and a standby mode, the supply voltage Vcc is outputted without any level reduction from the voltage supply circuit.

Subsequently in a write mode, the signal inputted to the inverter INV is turned to be "low" and then is inverted by the inverter INV to become "high", which is subsequently inputted to the gate electrodes of the MOS transistors Qa and Qb via the transfer gates Q1 and Q2. In case the control signal alone is inputted, the gate levels of the MOS transistors Qa and Qb become Vcc−Vth (where Vth is the threshold voltage of transistor Q1), so that the MOS transistor Qb is cut off while the MOS transistor Qa is turned on. It follows therefore that merely the voltage of Vcc−2Vth is outputted from the voltage supply circuit via the MOS transistor Qa. However, during a write mode where the pulse $\phi$ is also inputted to the charge pump, such pump is thereby actuated to boost the gate level of the MOS transistor Qa above Vpp +Vth (e.g. 15 volts). Consequently the writing voltage Vpp is outputted from the voltage supply circuit via the MOS transistor Qa without any level reduction.

According to the voltage supply circuit of the present invention, during both a read mode and a standby mode, the voltage Vcc is outputted directly from the p-channel MOS transistor Qb; and during a write mode, the gate level of the MOS transistor Qa is boosted by the charge pump to be higher than Vpp +Vth to compensate for the level reduction corresponding to the threshold voltage, whereby the voltage Vcc can also be outputted without the level reduction.

Furthermore, in the voltage supply circuit of the invention, the charge pump functioning as voltage multiplier means merely boosts the control signal fed to the gate of the MOS transistor Qa, so that the requisite is solely to output the current required for controlling the gate, and the output current itself of the voltage supply circuit during a write mode flows only in the MOS transistor Qa alone and never flows in the charge pump. Consequently the current capacity of the charge pump need not be great to eventually realize advantages that the dimensional increase of the charge pump can be averted and any wasteful augment of the power consumption by the charge pump is not induced. Furthermore, since no level reduction is caused as the voltage Vcc is outputted via the p-channel MOS transistor, there is no necessity of providing any particular boosting means with regard to the level reduction of Vcc. And the MOS transistor Qb is formed in the n-type well while the MOS transistor Qa is formed outside of the well, so that there occurs no flow of any great current that may otherwise be induced by latch-up between the Vpp and Vcc terminals or between the Vcc terminal and the ground either.

Figure 15:
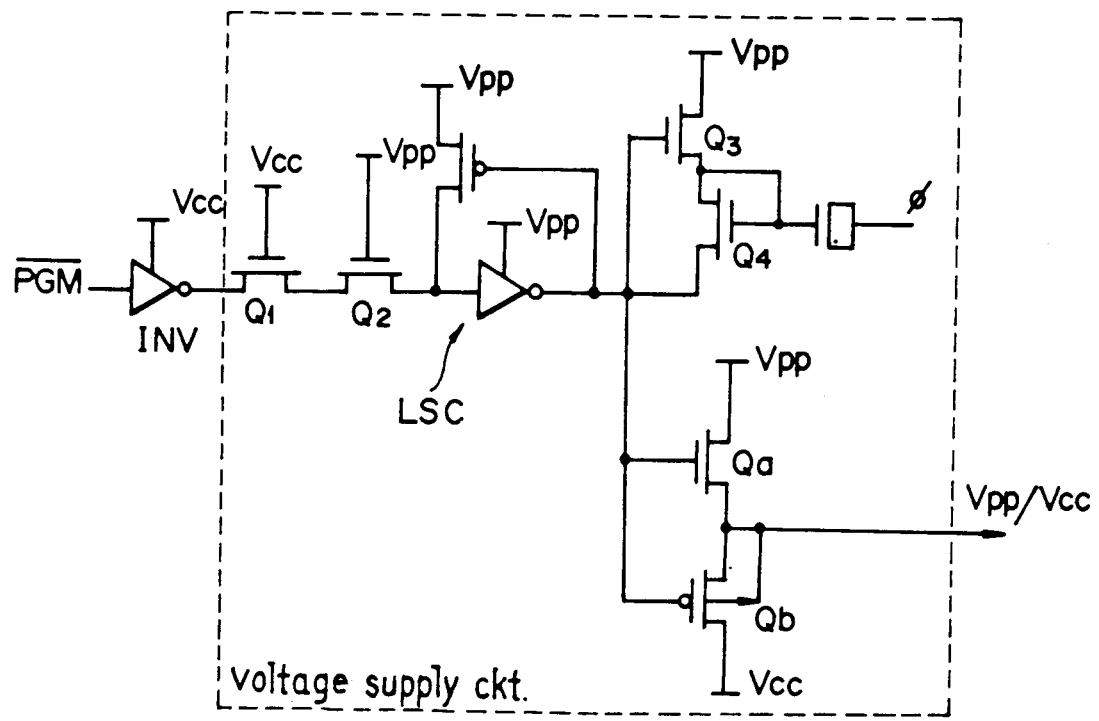
FIG. 15 is a circuit diagram showing a second embodiment of the voltage supply circuit according to the invention.

FIG. 15 shows a second embodiment of the voltage supply circuit according to the present invention. In this circuit, a level converter is disposed on the input side of MOS transistors Qa and Qb for converting a control signal PGM from the Vcc level to the Vpp level and then applying the level-converted voltage to the gates of the MOS transistors Qa and Qb. The level converter LSC consists of a CMOS inverter and a pullup p-channel MOS transistor. Except the provision of the level converter, the second embodiment is exactly the same as the foregoing first embodiment.

Due to the function of such level converter LSC, the gate level of the MOS transistors Qa (and Qb) is raised up to Vpp−Vth beyond Vcc−Vth when the operation is switched from a standby mode or a read mode to a write mode, i.e. when the input to the inverter INV is turned from "high" to "low". And a rise of the level from Vpp−Vth to a value above Vpp +Vth is performed by the charge pump, thereby shortening the time required to attain a state where the voltage Vpp is outputted from the source of the MOS transistor Qa. It signifies that the operation is expedited. As far as this point is concerned, the second embodiment is superior to the first embodiment.

Figure 16:
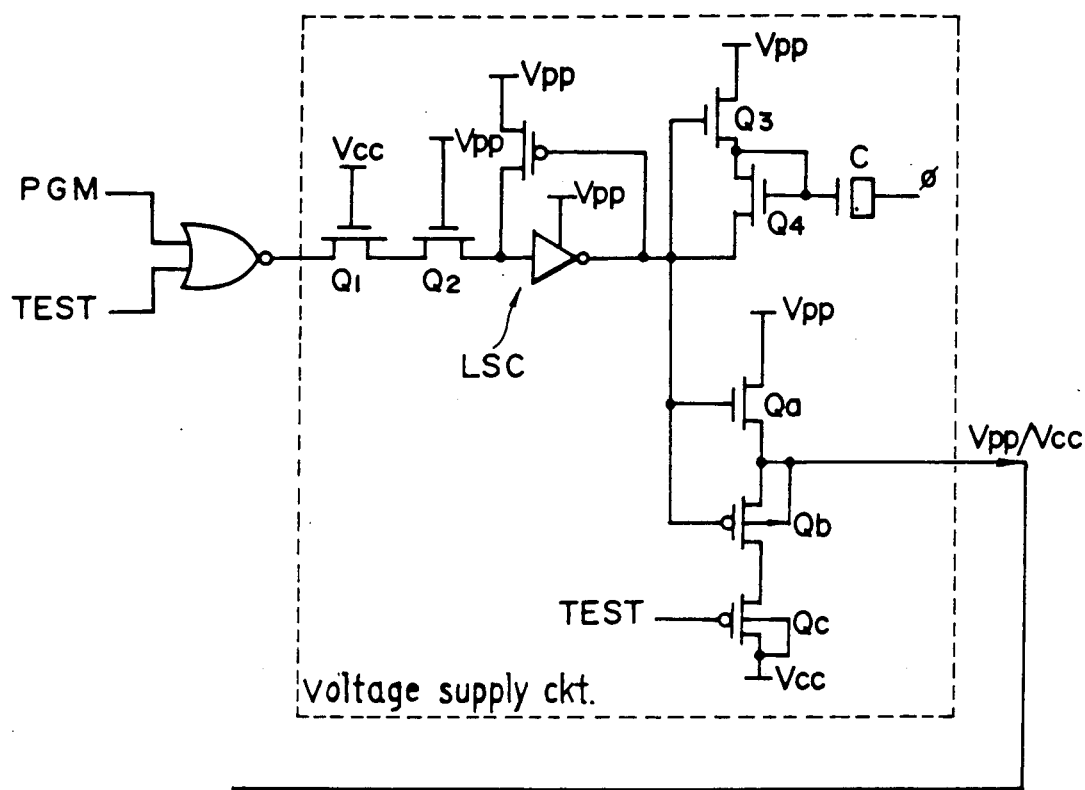
FIG. 16 is a circuit diagram showing a third embodiment of the voltage supply circuit according to the invention.
Figure 16:
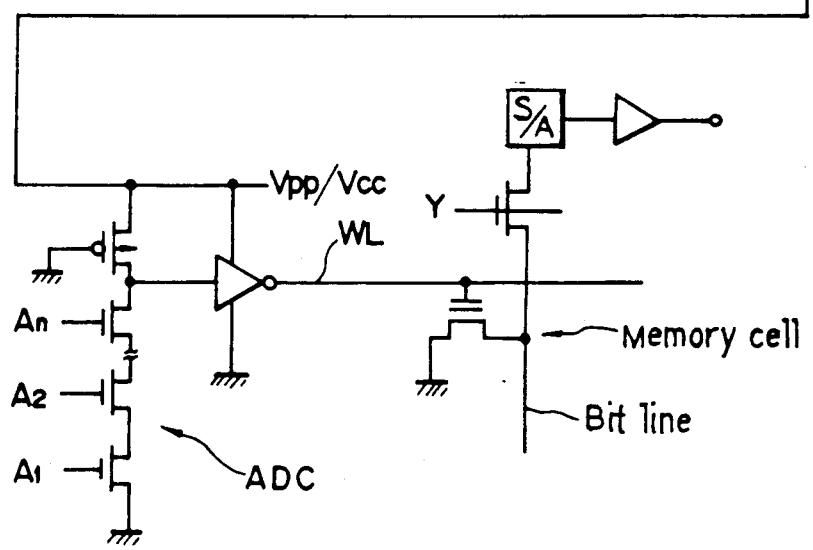

FIG. 16 shows a third embodiment of the voltage supply circuit according to the present invention, wherein a MOS transistor Qc is disposed between a MOS transistor Qb and a Vcc terminal so as not to bring about any impediment even when Vpp becomes lower than Vcc. In this circuit, the MOS transistor Qc can be cut off in case there exists a possibility that Vpp varies to be lower than Vcc. When testing the threshold voltage Vth of a memory cell in a non-volatile memory, the procedure is executed by first raising a writing voltage, which is applied to a word line WL, from 3 volts or so gradually at a rate of, e.g. 0.5 volt, and then detecting the value of the writing voltage where a data signal read out from a bit line via a sense amplifier and a buffer amplifier is switched. The writing voltage is applied from the Vpp terminal to the word line WL via the voltage supply circuit and an address decoder ADC (particularly its buffer), so that when the circuit is so formed as to enable measurement of the threshold voltage Vth, it is necessary to change the supply voltage Vpp from 3 volts to 10 volts or so. Consequently there may occur some occasions where the supply voltage Vpp becomes lower than Vcc. Then, in the circuits of FIGS. 14 and 15, a great current comes to flow from the Vcc terminal via the MOS transistors Qb and Qa to the Vpp terminal. Meanwhile in the voltage supply circuit of FIG. 16, the MOS transistor Qc is disposed between the MOS transistor Qb and the Vcc terminal so as to prevent flow of any great current to the MOS transistor Qb, whereby the current can be cut at the execution of such a test.

Figure 17:
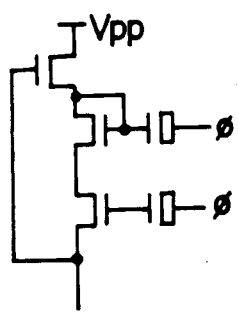
FIG. 17 is a circuit diagram showing another exemplary charge pump used as a voltage multiplier.
Figure 18:
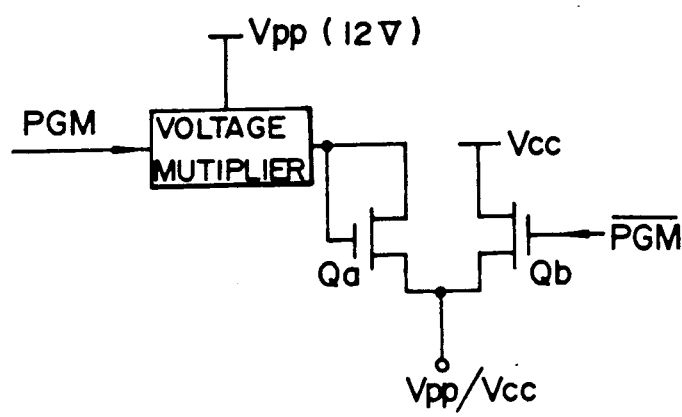
FIGS. 18 through 21 are circuit diagrams of first through fourth conventional examples.
Figure 19:
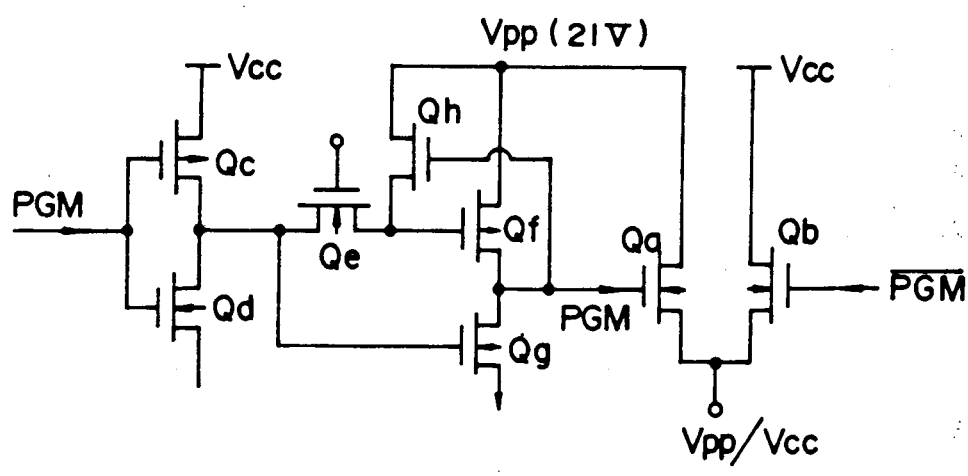
Figure 20:
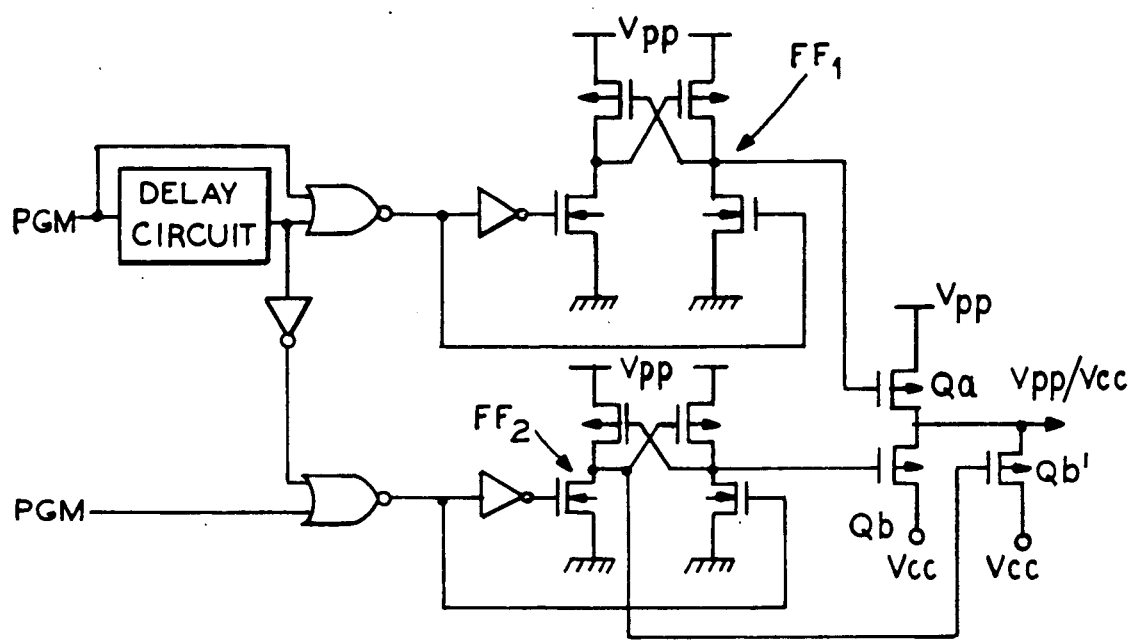
Figure 22:
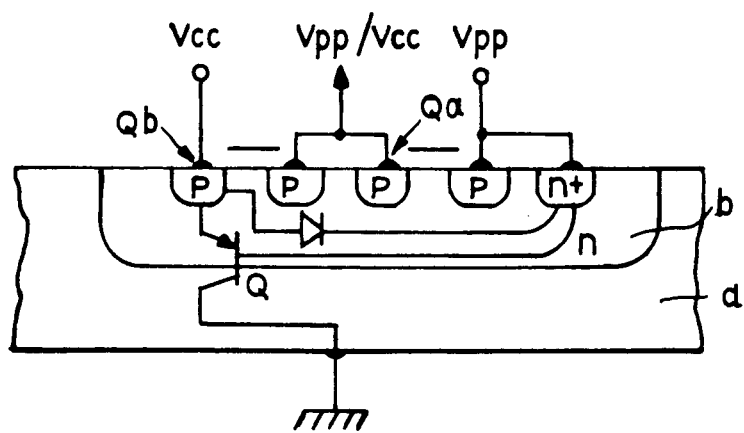
FIG. 22 is a sectional view illustrating the problems in the third conventional example.
Figure 21:
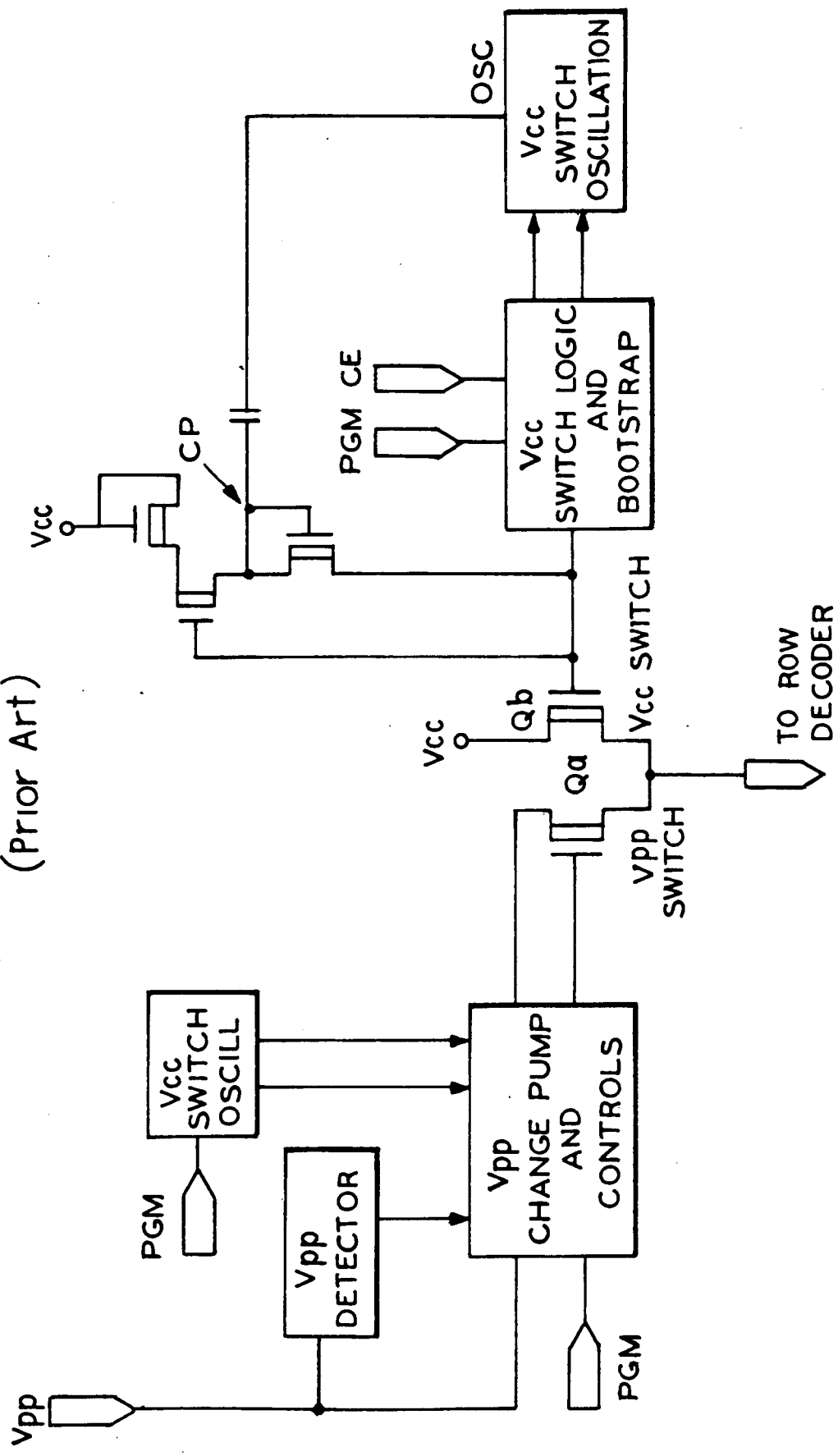

Each of the above-described embodiments is equipped with merely one stage of a charge pump. And even a single stage is capable of boosting the voltage up to Vpp $+\alpha$ (V$\phi$−Vth [V$_{BG}$∼Vpp]) and is therefore sufficient to achieve considerable effects for prevention of a level reduction. However, for attaining further sufficient effects in prevention of a level reduction with more certainty, two-stage charge pumps may be employed as shown in FIG. 17.

As described hereinabove, according to the address decoder circuit of the present invention for a non-volatile memory, the required potential is outputted in a selection state during both reading and writing operations but is not outputted in a non-selection state. Meanwhile, the required potential is not outputted, in a selection state during an erasing operation to consequently permit application of a negative voltage to the word line, hence enabling erasure. Furthermore, in a non-selection state, a third potential is applied to the word line to prevent erasure, thereby achieving bit-by-bit erasure.

And the output logic is reversed in the writing/ reading operation and the erasing operation by changing the potential applied to the power terminals at the two ends of the circuit consisting of a load MOS transistor and address input MOS transistors. Thus, the address decoder circuit can be constituted merely of a buffer and a decoding portion which consists of the load MOS transistor and the address input MOS transistors. Consequently it becomes possible to perform electrical erasure without numerically increasing the component elements of the address decoder circuit.

Also as described above, the address decoder circuit of the present invention for a non-volatile memory comprises load means and MOS transistors to receive input address signals, wherein the absolute value of a variable supply voltage is changed to be greater in a write mode than in a read mode. And the feature of the invention resides in that the load means is composed of a variable resistor whose resistance is decreased during a reading operation and is increased during a writing operation.

Therefore, according to the address decoder circuit of the invention for a non-volatile memory, the resistance of the load means is rendered greater despite rise of the supply voltage during a write mode, so that the current flowing in the load means is not increased at all or is increased merely slightly even in the writing operation, hence averting wasteful augment of the power consumption.

Furthermore, since the current flowing in the writing operation is not exactly far greater than that in the reading operation, there is no necessity of enlarging the sizes of the load means and the MOS transistors to consequently minimize the area occupied by the address decoder circuit, hence giving a contribution to high integration density of the memory.

And finally in a voltage supply circuit for selectively outputting a first voltage or a second voltage in response to a control signal, the feature of the invention resides in that the first voltage is outputted via a MOS transistor switched by a voltage obtained by boosting the control signal through a voltage multiplier.

Therefore, according to the voltage supply circuit of the invention, the control signal used for controlling the MOS transistor is merely boosted by the voltage multiplier, which is thereby not burdened with the output current of the voltage supply circuit. Consequently, only the control signal alone flows in the voltage multiplier despite the compensation carried out by the voltage multiplier for a level reduction corresponding to the threshold voltage of the MOS transistor, so that the current flowing in such voltage multiplier can be minimized. As a result, there is none of the known drawbacks that a large area is occupied by the voltage multiplier or a great power is consumed by the same.

WHAT IS CLAIMED IS:

1. An address decoder circuit for a non-volatile memory which produces, in a selection state, a first potential during a reading operation or a second potential greater in absolute value than the first potential during a writing operation, said address decoder circuit comprising:
   a load MOS transistor connected at one end thereof to a first terminal;
   one or more series-connected address input MOS transistors receiving address signals at gates thereof and coupled between the other end of said load MOS transistor and a second terminal; and
   a buffer receiving as an input a signal from a node of said load MOS transistor and said address input MOS transistor, and also receiving as a supply voltage the voltage between a third terminal and a reference potential terminal;
   wherein, during a reading operation, the first potential is outputted from the selected buffer by applying the first potential to both the first and third terminals; during a writing operation, the second potential is outputted from the selected buffer by applying the second potential to both the first and third terminals; and during an erasing operation, a third potential is outputted in a non-selection state by applying a third potential to both the second and third terminals.

2. An address decoder circuit according to claim 1, wherein a reference potential is outputted in a selection state during an erasing operation, so that a negative voltage is applied to the control gate of the non-volatile memory to allow injection of positive holes into the floating gate thereof.

3. An address decoder circuit according to claim 1, wherein the back gate of said load MOS transistor is connected to the third terminal.

4. An address decoder circuit for a non-volatile memory which comprises load means and MOS transistors supplied with address signals and receives a variable supply voltage whose absolute value in a writing operation is greater than that in a reading operation, wherein said load means is composed of a variable resistance means whose resistance becomes lower in the reading operation and higher in the writing operation.

5. An address decoder circuit according to claim 4, wherein the resistance of said load means is controlled by resistance control means in such a manner as to vary in conformity with the change in the variable supply voltage within a range between a write voltage and a read voltage.

* * * * *